(12) United States Patent  
Beatty et al.

(10) Patent No.: US 8,709,869 B2  
(45) Date of Patent: Apr. 29, 2014

(54) METHOD OF MANUFACTURING A PLURALITY OF ELECTRONIC ASSEMBLIES

(75) Inventors: John J. Beatty, Chandler, AZ (US); Jason A. Garcia, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/620,477

(22) Filed: Sep. 14, 2012

(65) Prior Publication Data

US 2013/0032953 A1 Feb. 7, 2013

Related U.S. Application Data

(62) Division of application No. 10/897,067, filed on Jul. 21, 2004, now abandoned.

(51) Int. Cl.  
*H01L 21/00* (2006.01)

(52) U.S. Cl.  
USPC ........... 438/108; 438/107; 438/109; 438/458; 438/459; 438/462

(58) Field of Classification Search  
USPC .......................... 438/107–109, 458, 459, 462  
See application file for complete search history.

(56) References Cited

U.S. PATENT DOCUMENTS

| | | | |
|---|---|---|---|
| 5,646,067 A * | 7/1997 | Gaul | 438/458 |
| 5,844,320 A | 12/1998 | Ono et al. | |
| 6,213,647 B1 | 4/2001 | Lin | |
| 6,281,046 B1 | 8/2001 | Lam | |
| 6,376,278 B1 | 4/2002 | Egawa et al. | |
| 6,440,771 B1 * | 8/2002 | Pierce | 438/106 |
| 6,589,801 B1 | 7/2003 | Yoon et al. | |
| 6,777,313 B2 | 8/2004 | Takyu et al. | |
| 6,815,712 B1 | 11/2004 | Kline | |
| 6,822,324 B2 * | 11/2004 | Tao et al. | 257/710 |
| 6,906,425 B2 | 6/2005 | Stewart et al. | |
| 6,940,181 B2 | 9/2005 | Derderian et al. | |
| 6,982,487 B2 | 1/2006 | Kim et al. | |
| 7,348,215 B2 | 3/2008 | Lee | |
| 7,358,618 B2 | 4/2008 | Shibata | |
| 7,411,297 B2 | 8/2008 | Luo et al. | |
| 2002/0110953 A1 | 8/2002 | Ahn et al. | |
| 2002/0195706 A1 | 12/2002 | Irie | |

(Continued)

OTHER PUBLICATIONS

International Search Report for PCT/US2005/024487 mailed Jun. 29, 2006, 3 pages.

(Continued)

*Primary Examiner* — Bac Au  
(74) *Attorney, Agent, or Firm* — Blakely, Sokoloff, Taylor & Zafman LLP

(57) ABSTRACT

A method of manufacturing a plurality of electronic devices is provided. Each one of a plurality of first conductive terminals on a plurality of integrated circuits formed on a device wafer is connected to a respective one of a plurality of second conductive terminals on a carrier wafer, thereby forming a combination wafer assembly. The combination wafer assembly is singulated between the integrated circuits to form separate electronic assemblies. The combination wafer assembly also allows for an underfill material to be introduced and to be cured at wafer level and for thinning of the device wafer at wafer level without requiring a separate supporting substrate. Alignment between the device wafer and the carrier wafer can be tested by conducting a current through first and second conductors in the device and carrier wafers, respectively.

10 Claims, 3 Drawing Sheets

(56) References Cited

U.S. PATENT DOCUMENTS

| | | |
|---|---|---|
| 2003/0122241 A1 | 7/2003 | Wang et al. |
| 2003/0166313 A1 | 9/2003 | Nishikawa et al. |
| 2004/0126927 A1 | 7/2004 | Lin et al. |
| 2005/0029667 A1 | 2/2005 | Yamashita et al. |
| 2005/0046002 A1* | 3/2005 | Lee et al. .................. 257/678 |
| 2005/0059217 A1* | 3/2005 | Morrow et al. ............ 438/455 |
| 2005/0194695 A1 | 9/2005 | Lin et al. |
| 2006/0049498 A1 | 3/2006 | Kovac et al. |

OTHER PUBLICATIONS

Written Opinion for PCT/US2005/024487 mailed Jan. 21, 2007, 5 pages.

International Preliminary Report on Patentability for PCT/US2005/024487 mailed Jan. 23, 2007, 6 pages.

* cited by examiner

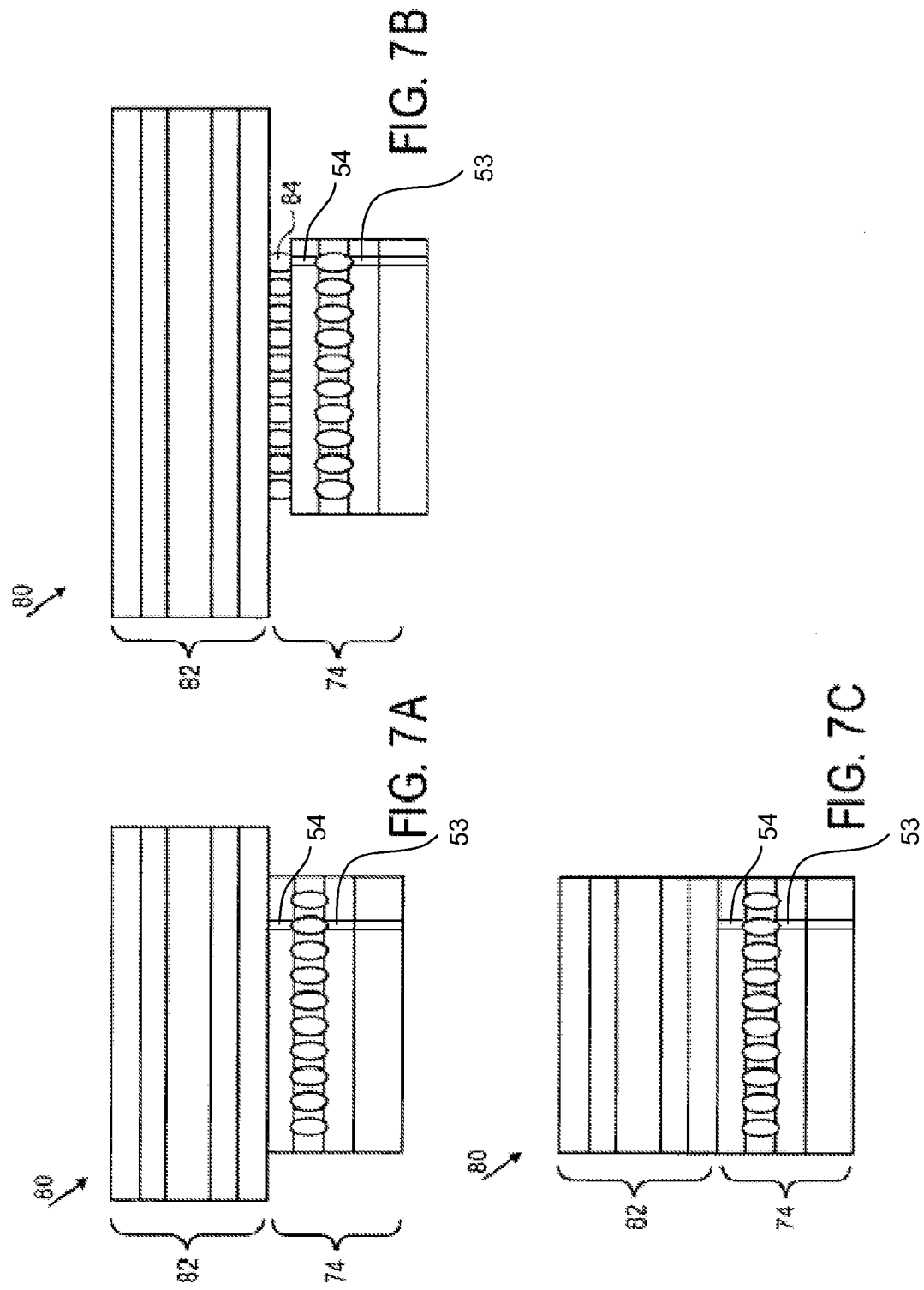

METHOD OF MANUFACTURING A PLURALITY OF ELECTRONIC ASSEMBLIES

BACKGROUND OF THE INVENTION

1). Field of the Invention

This invention relates generally to a method of manufacturing a plurality of electronic assemblies, and more specifically to improvements in fabrication at wafer level.

2). Discussion of Related Art

Integrated circuits are usually manufactured in and on semiconductor wafers. Such an integrated circuit has millions of tiny electronic components such as transistors, capacitors, and diodes that are interconnected with conductive lines, plugs, and vias.

One wafer typically has an array of identical circuits formed thereon. The wafer was is then "singulated" or "diced" by directing a blade through scribe streets between the integrated circuits, thereby separating the wafer into the individual dice. Each die is then separately mounted to a respective carrier substrate for purposes of providing structural rigidity to the die and to provide power, ground, and signals to and from the die.

A plurality of conductive terminals are formed on the integrated circuits before the wafer is singulated. Such terminals are typically solder bumps that are formed according to a conventional "controlled collapsed chip connect" (C4) process. After the wafer is singulated, each one of the bumps is placed on a respective contact of the carrier substrate. The bumps are then reflowed so that they are structurally and electrically connected to the contacts. The process is repeated to connect each die singulated from the wafer to a separate carrier substrate to form separate electronic assemblies. Downstream fabrication is then separately carried out on each separate electronic assembly.

BRIEF DESCRIPTION OF THE DRAWINGS

The invention is described by way of examples with reference to the accompanying drawings, wherein:

FIGS. 7A, 7B, and 7C are views similar to FIG. 6, further illustrating packages that can be made from the electronic assemblies that are singulated out of the combination wafer as illustrated in FIG. 6.

DETAILED DESCRIPTION OF THE INVENTION

A method of manufacturing a plurality of electronic devices is provided. Each one of a plurality of first conductive terminals on a plurality of integrated circuits formed on a device wafer is connected to a respective one of a plurality of second conductive terminals on a carrier wafer, thereby forming a combination wafer assembly. The combination wafer assembly is singulated between the integrated circuits to form separate electronic assemblies. Each electronic assembly has a respective die from a separated portion of the device wafer and a carrier substrate from a separated portion of the carrier wafer. The process of fabricating electronic assemblies is simplified and costs are reduced because the dies are connected to the carrier substrate at wafer level, i.e., before singulation. The combination wafer assembly also allows for an underfill material to be introduced and to cured at wafer level and for thinning of the device wafer at wafer level without requiring a separate supporting substrate. Alignment between the device wafer and the carrier wafer can be tested by conducting a current through first and second conductors in the device and carrier wafers, respectively.

Figure 1:
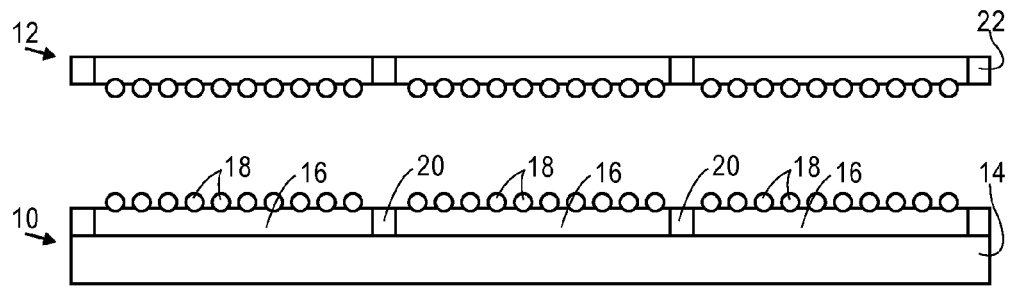
FIG. 1 is a cross-sectional side view of first and second wafer assemblies that are used for forming a combination wafer assembly, according to an embodiment of the invention.

FIG. 1 of the accompanying drawings illustrates first and second wafer assemblies 10 and 12 that are used for manufacturing a combination wafer assembly and a plurality of electronic assemblies from the combination wafer assembly, according to an embodiment of the invention.

The first wafer assembly 10 includes a device wafer 14, a plurality of integrated circuits 16 formed on the device wafer 14, and a plurality of conductive first terminals 18 formed on each one of the integrated circuits 16. The device wafer 14 is made of a semiconductor material such as silicon. The integrated circuits 16 are typically identical to one another. Each integrated circuit 16 has a multitude of electronic elements such as transistors, capacitors, diodes, etc., formed in and on the material of the device wafer 14. Each integrated circuit 16 has a plurality of alternating dielectric and metal layers formed above one another. The metal layers are patterned to form metal lines that interconnect the electronic components to one another. The first terminals 18 are bumps that are formed on the integrated circuit and connected through the metal lines, plugs and vias to the electronic components. The bumps are typically formed according to a conventional controlled collapsed chip connect (C4) process. The integrated circuits 16 are separated from one another by scribe streets 20. A metal guard ring (not shown) typically surrounds each integrated circuit 16 to protect the respective integrated circuit 16 from delamination during downstream sawing or other singulation.

The second wafer assembly 12 includes a carrier wafer 22, typically of a strong material such as ceramic, and a second plurality of conductive terminals 24 formed on a lower surface of the carrier wafer 22. The carrier wafer 22 is typically made of a ceramic material and has metal lines, plugs, and vias formed in the ceramic material for purposes of electric communication. The second terminals 24 are connected to the conductive metal lines, plugs, and vias. The second terminals 24 are typically made utilizing a C4 process.

The layout of the second terminals 24 is a mirror image of the layout of the first terminals 18, and each one of the second terminals 24 is located directly above a respective one of the first terminals 18. The second wafer assembly 12 is then lowered onto the first wafer assembly 10 so that a respective one of the second terminals 24 is in contact with a respective one of the first terminals 18. The combination is then heated to a temperature above a melting temperature of the first terminals 18 and 24, so that each one of the second terminals 24 reflows together with the respective one of the first terminals 18. The combination is then allowed to cool, so that the reflowed terminals again solidify.

Figure 2:
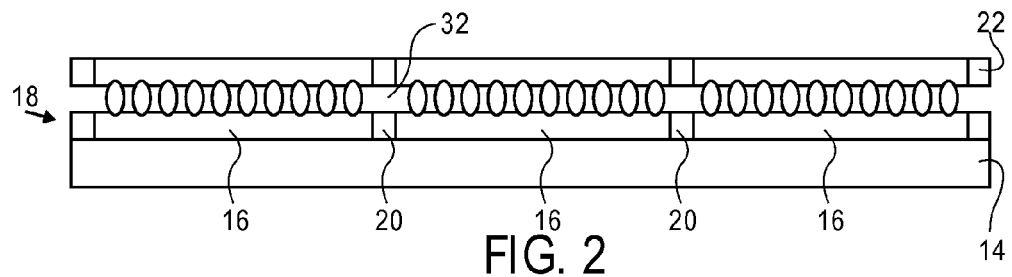
FIG. 2 is a view similar to FIG. 1 after the first and second wafer assemblies are connected to one another by reflowing the first and second terminals of respectively the first and second wafer assemblies with one another to form combined terminals.

FIG. 2 illustrates a combination wafer assembly 28 that results after the first and second terminals 18 and 24 of FIG. 1 are reflowed together and allowed to cool. Combined terminals 30 are formed that interconnect the integrated circuits 16 with the carrier wafer 22. A space 32 is maintained between the integrated circuits 16 and the carrier wafer 22, and a volume between the combined terminals 30 is filled with a gas, typically air.

It can be seen that the integrated circuits 16 are connected to the carrier wafer 22 without first singulating the first wafer assembly 10. Wafer-level interconnection simplifies the entire assembly process, thereby reducing cost. Wafer level interconnection also allows for downstream manufacture, including the introduction of underfill material and wafer thinning, to be carried out at wafer level, thereby further simplifying the entire process and further reducing cost.

Figure 3:
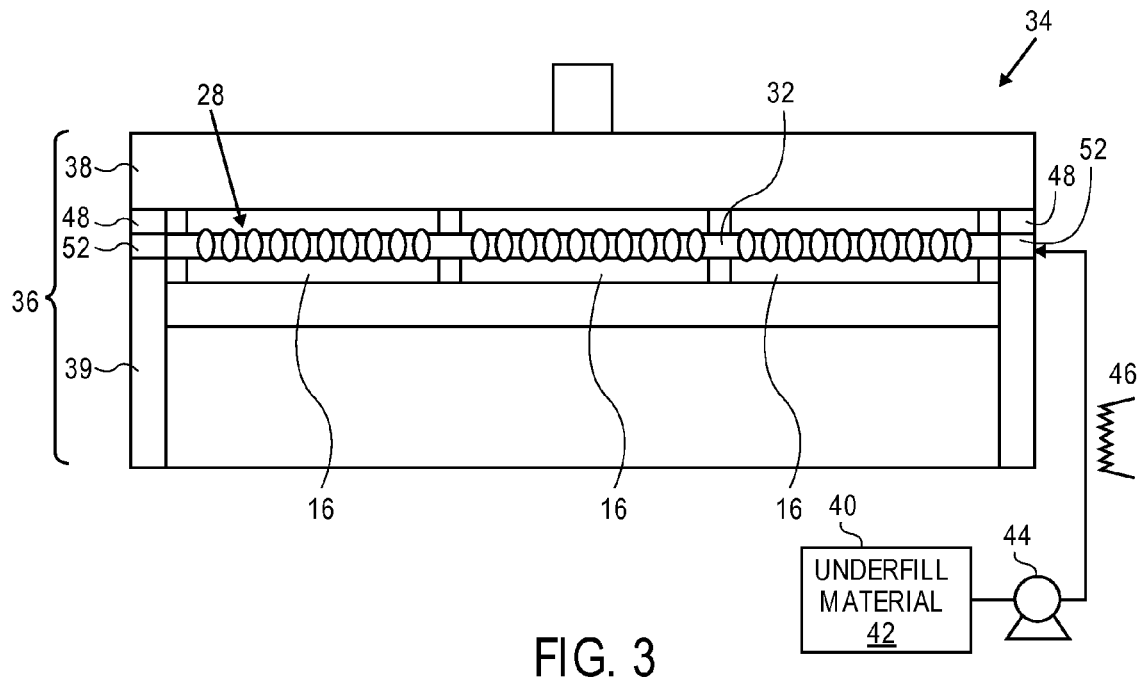
FIG. 3 is a view similar to FIG. 2, further illustrating a system that is used to introduce an underfill material into a space between the combined terminals.

FIG. 3 illustrates a system 34 that is used to introduce an underfill material into the space 32 of the combination wafer assembly 28. The system 34 includes a jig 36, having upper and lower parts 38 and 39, a reservoir 40 for underfill material 42, a pump 44, and a heater 46.

That lower part 39 of the jig 36 has a recess in which the combination wafer assembly 28 is received. Sidewalls 48 of the lower part 39 surround the combination wafer assembly 28, in particular the space 32. First and second passages 50 and 52 are formed through the sidewalls 48 and into and out of the space 32. The reservoir 40 is connected through that pump 44 to the first passage 50 to allow for the underfill material 42 to be pumped by the pump 44 into the first passage 50. The heater 46 is located in a position to heat the underfill material before being provided to the first passage 50.

The upper part 38 of the jig 36 is located on top of the combination wafer assembly 28, the upper and lower parts 38 and 39 thereby forming a sealed enclosure around the combination wafer assembly 28, except for the first and second passages 50 and 52.

In use, the pump 44 is operated to pump the underfill material 42 out of the reservoir 40 past the heater 46. The heater 46 then heats the underfill material 42 to lower its viscosity. The heated underfill material 42 then flows above atmospheric pressure through the first passage 50 into the space 32. A gas located in the space 32 is vented through the second passage 52. The process is continued until the space 32 is entirely filled with the underfill material 42. It may be possible to provide more inlet passages than just the first passage 50 and/or more outlet passages than just the second passage 52, and that the passages can be placed at select locations to tailor flow through the space 32.

After the underfill material 42 is introduced at wafer level, the combination wafer assembly 28 may be removed from the jig 36. The combination wafer assembly 28, with the underfill material 42 in the space 32, can then be transported through a furnace. The underfill material 42 is heated to a select temperature and for a predetermined period of time to cure the underfill material 42, also at wafer level.

Figure 4:
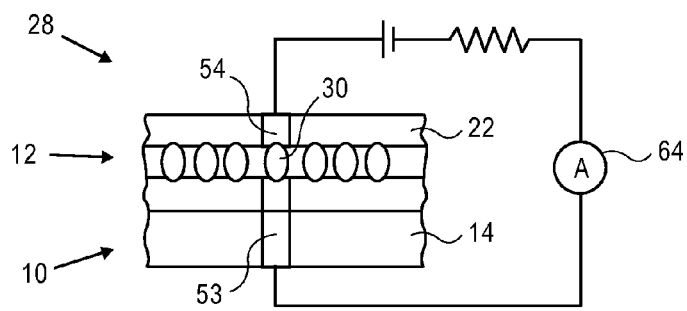
FIG. 4 is a view similar to FIG. 3 of a portion of the combination wafer, illustrating how alignment between the first and second wafer assemblies is tested.

FIG. 4 illustrates how alignment between the first and second wafer assemblies 10 and 12 is tested before the combination wafer assembly 28 is singulated. First and second conductors 53 and 54 are formed through the device wafer 14 and the carrier wafer 22, respectively. Both conductors 53 and 54 are connected to one of the combined terminals 30 if the second wafer assembly 12 has been properly aligned with the first wafer assembly 10. No current will conduct if the second wafer assembly 12 is misaligned with respect to the first wafer assembly 10. A circuit is completed by connecting the second conductor 54 through a power supply such as a battery 60, a resistor 62, and a current meter 64 to the first conductor 53. A current will be displayed on the current meter 64 if the first and second wafer assemblies 10 and 12 are correctly aligned.

Figure 5:
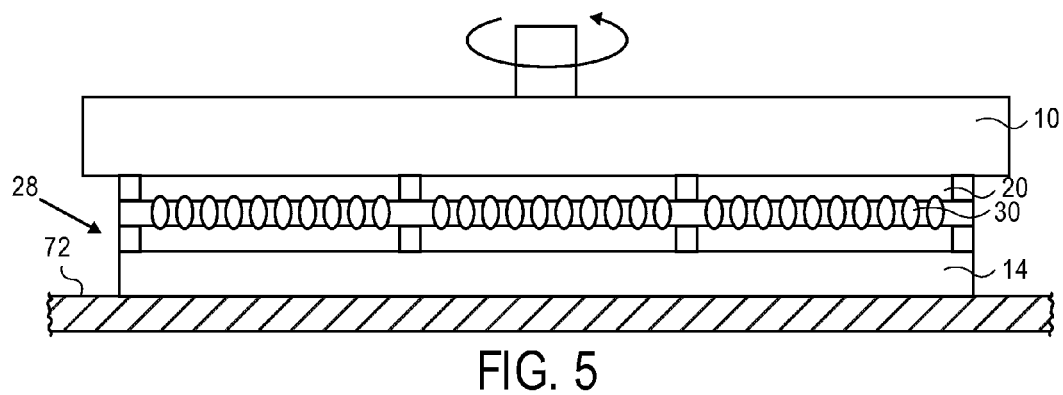
FIG. 5 is a view similar to FIG. 2, further illustrating how a device wafer of the first wafer assembly is thinned without the need to laminate the first wafer to a supporting substrate.

As illustrated in FIG. 5, the combination wafer assembly 28 also allows for thinning of the device wafer 14 without the need to laminate the first wafer assembly 10 to a supporting substrate, due to the strength provided by the ceramic carrier wafer 22. The carrier wafer 22 is attached to a polishing chuck 70. The polishing chuck 70 is then used to place the combination wafer assembly 28 with the device wafer 14 contacting a polishing pad 72. The polishing chuck 70 and polishing pad 72 are then moved, typically rotated, relative to one another so that a lower surface of that device wafer 14 moves over an upper surface of the polishing pad 72. An upper surface of the polishing pad 72 is abrasive so that lower portions of the device wafer 14 are removed. The device wafer 14 is so thinned down. The combination wafer assembly 28 is then removed from the polishing pad 72 and the polishing chuck 70.

Figure 6:
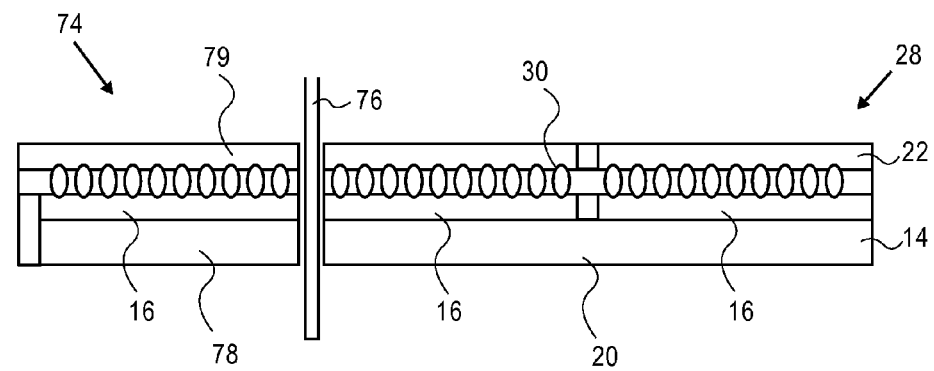
FIG. 6 is a view similar to FIG. 2, further illustrating how the combination wafer assembly is singulated into a plurality of electronic assemblies.

As illustrated in FIG. 6, the combination wafer assembly 28 is subsequently singulated into individual electronic assemblies 74. A blade 76 is directed in x- and y-directions through the scribe streets 20 and through the carrier wafer 22. Each electronic assembly 74 then has a respective die 78 from a respective portion of the device wafer 14 and one of the integrated circuits 16 on the respective die 78. Each electronic assembly 74 also has a respective carrier substrate 79 from a respective portion of the carrier wafer 22. The combination wafer assembly 28 is thus singulated after interconnection as illustrated in FIG. 2, the introduction of an underfill material as illustrated in FIG. 3, alignment testing as illustrated in FIG. 4, and thinning as illustrated in FIG. 5.

FIGS. 7A, 7B, and 7C illustrate various assembly packages 80 that can be made from one of the electronic assemblies 74. Each one of the packages 80 includes a further substrate 82 that is made from a laminate of conductive and dielectric layers. In the embodiments of FIGS. 7A and 7C, the additional substrate 82 is formed directly on the electronic assembly 74. In the embodiment of FIG. 7B, additional conductive contacts 84 interconnect the electronic assembly 74 with the additional substrate 82. It can be seen, whereas the electronic assemblies 74 depicted in FIGS. 7A and 7B have a smaller footprint than the further substrates 82, the electronic assembly 74 depicted in FIG. 7C has the same footprint as the further substrate 82.

While certain exemplary embodiments have been described and shown in the accompanying drawings, it is to be understood that such embodiments are merely illustrative and not restrictive of the current invention and that this invention is not restricted to the specific constructions and arrangements shown and described since modifications may occur to those ordinarily skilled in the art.

What is claimed:
1. A combination wafer assembly, comprising:
a device wafer wherein the device wafer includes a first conductor that is formed through the device wafer;
a plurality of integrated circuits formed on the device wafer;
a plurality of first conductive terminals on the integrated circuits and at least one first conductive terminal on the first conductor;
a carrier wafer wherein the carrier wafer includes a second conductor that is formed through the carrier wafer; and
a plurality of second conductive terminals on the carrier wafer and at least one second conductive terminal on the second conductor, each being connected to a respective one of the first conductive terminals, wherein the first conductive terminal formed on the first conductor is connected to the second conductive terminal formed on the second conductor, wherein the first and second conductors are electrically isolated from the plurality of integrated circuits.

2. The combination wafer assembly of claim 1, wherein the integrated circuits are identical to one another.

3. The combination wafer assembly of claim 1, further comprising:
   a plurality of interconnection elements connecting each one of the first conductive terminals to each one of the second conductive terminals; and
   an underfill material in a space between the device wafer and the carrier wafer and between the interconnection elements, the underfill material having been cured.

4. The combination wafer assembly of claim 1, wherein a die is singulated from the combination wafer assembly to form an electronic assembly, further including a further substrate onto which the electronic assembly has been directly formed.

5. The combination wafer assembly of claim 1, wherein a die is singulated from the combination wafer assembly to form an electronic assembly, further including a further substrate onto which the electronic assembly has been formed, and wherein an additional conductive contact interconnects the electronic assembly with the additional substrate.

6. An assembly, comprising:
   a device wafer wherein the device wafer includes a first conductor that is formed through the device wafer;
   a plurality of integrated circuits formed on the device wafer;
   a plurality of first conductive terminals on the integrated circuits and at least one first conductive terminal on the first conductor;
   a carrier wafer wherein the carrier wafer includes a second conductor that is formed through the carrier wafer;
   a plurality of second conductive terminals on the carrier wafer and at least one second conductive terminal on the second conductor, each being connected to a respective one of the first conductive terminals, wherein the first conductive terminal formed on the first conductor is connected to the second conductive terminal formed on the second conductor, wherein the first and second conductors are electrically isolated from the plurality of integrated circuits, wherein a die is singulated from the combination wafer assembly to form an electronic assembly; and
   a further substrate onto which the electronic assembly is formed.

7. The combination wafer assembly of claim 6, wherein the further substrate has been directly formed which the electronic assembly.

8. The combination wafer assembly of claim 6, wherein the further substrate has been formed on the electronic assembly with an additional conductive contact that interconnect the electronic assembly with the additional substrate.

9. The assembly of claim 6 wherein the further substrate has a footprint that is larger than the electronic assembly.

10. The assembly of claim 6 wherein the further substrate has a footprint that is the same as the electronic assembly.

* * * * *